(12) United States Patent
Moon et al.

(10) Patent No.: US 7,863,142 B2
(45) Date of Patent: Jan. 4, 2011

(54) METHOD OF FORMING A GERMANIUM SILICIDE LAYER, SEMICONDUCTOR DEVICE INCLUDING THE GERMANIUM SILICIDE LAYER, AND METHOD OF MANUFACTURING THE SEMICONDUCTOR DEVICE

(75) Inventors: Chang-wook Moon, Seoul (KR); Hyun-deok Yang, Yongin-si (KR); Joong S. Jeon, Seongnam-si (KR); Hwa-sung Rhee, Seongnam-si (KR); Nae-in Lee, Seoul (KR); Weiwei Chen, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 222 days.

(21) Appl. No.: 12/078,750

(22) Filed: Apr. 4, 2008

(65) Prior Publication Data
US 2009/0146183 A1 Jun. 11, 2009

(30) Foreign Application Priority Data
Dec. 7, 2007 (KR) ............... 10-2007-0126911

(51) Int. Cl.
*H01L 21/336* (2006.01)

(52) U.S. Cl. ............. 438/285; 438/483; 438/590; 438/E21.09; 438/E29.255

(58) Field of Classification Search ............. 438/44, 438/163, 197, 290, 383
See application file for complete search history.

(56) References Cited

U.S. PATENT DOCUMENTS

| 6,797,614 | B1 * | 9/2004 | Paton et al. ............ 438/655 |
| 7,432,559 | B2 * | 10/2008 | Lai et al. ............ 257/377 |
| 7,449,782 | B2 * | 11/2008 | Cabral et al. ............ 257/768 |
| 2008/0132019 | A1 * | 6/2008 | Ku et al. ............ 438/300 |
| 2009/0108378 | A1 * | 4/2009 | Zhu et al. ............ 257/412 |

* cited by examiner

*Primary Examiner*—Dung A. Le
(74) *Attorney, Agent, or Firm*—Harness, Dickey & Pierce, PLC

(57) ABSTRACT

Example embodiments relate to a method of forming a germanium (Ge) silicide layer, a semiconductor device including the Ge silicide layer, and a method of manufacturing the semiconductor device. A method of forming a Ge silicide layer according to example embodiments may include forming a metal layer including vanadium (V) on a silicon germanium (SiGe) layer. The metal layer may have a multiple-layer structure and may further include at least one of platinum (Pt) and nickel (Ni). The metal layer may be annealed to form the germanium silicide layer. The annealing may be performed using a laser spike annealing (LSA) method.

17 Claims, 6 Drawing Sheets

METHOD OF FORMING A GERMANIUM SILICIDE LAYER, SEMICONDUCTOR DEVICE INCLUDING THE GERMANIUM SILICIDE LAYER, AND METHOD OF MANUFACTURING THE SEMICONDUCTOR DEVICE

PRIORITY STATEMENT

This application claims priority under 35 U.S.C. §119 to Korean Patent Application No. 10-2007-0126911, filed on Dec. 7, 2007 in the Korean Intellectual Property Office (KIPO), the entire contents of which are incorporated herein by reference.

BACKGROUND

1. Technical Field

Example embodiments relate a method of forming a metal silicide layer, a semiconductor device including the metal silicide layer, and a method of manufacturing the semiconductor device including the metal silicide layer.

2. Description of the Related Art

The gate width of transistors as well as the thickness and surface area of source/drain regions may be reduced to enhance the integration of semiconductor devices. However, difficulties may arise with regard to reducing the contact and sheet resistance of a gate, a channel, and/or source/drain regions. For example, to reduce contact resistance, a silicide layer may be formed on the gate and the source/drain regions. However, a conventional silicide layer may not have a sufficiently low specific resistance. Additionally, a conventional silicide layer may have agglomeration and diffusion effects which may adversely affect the formation of a relatively uniform and/or thin layer. Consequently, a conventional silicide layer may not provide the lower contact resistance required for next-generation, higher-speed semiconductor devices.

SUMMARY

Example embodiments relate to a method of forming a germanium silicide layer that may be used as a contact layer in a semiconductor device. Example embodiments also relate to a semiconductor device including the germanium silicide layer and a method of manufacturing the semiconductor device. A method of forming a germanium (Ge) silicide layer according to example embodiments may include forming a metal layer on a silicon germanium (SiGe) layer, wherein the metal layer may include vanadium (V). The metal layer may be annealed to form the germanium silicide layer. The metal layer may further include at least one of platinum (Pt) and nickel (Ni). The metal layer may be formed to have a single-layer structure or a multiple-layer structure. Forming a multiple-layer structure may include forming a vanadium layer. Additionally, a platinum layer may be formed on the silicon germanium layer; the vanadium layer may be formed on the platinum layer; and a nickel layer may be formed on the vanadium layer. Alternatively, the vanadium layer may be formed on the silicon germanium layer; a platinum layer may be formed on the vanadium layer; and a nickel layer may be formed on the platinum layer. The annealing may be performed using a laser spike annealing (LSA) method. The silicon germanium layer may be formed using an epitaxial growth method.

A semiconductor device according to example embodiments may include a first silicon germanium region; a germanium silicide layer including vanadium (V) on the first silicon germanium region; and/or a conductive layer on the germanium silicide layer. The germanium silicide layer may further include at least one of platinum (Pt) and nickel (Ni). The first silicon germanium region may be an epitaxial region. The semiconductor device according to example embodiments may further include a substrate having the first silicon germanium region and a second silicon germanium region as source and drain regions; a gate on the substrate and between the source and drain regions; the germanium silicide layer on the source and drain regions; and/or the conductive layer on the germanium silicide layer, wherein the conductive layer is a conductive plug, so as to achieve a transistor. The substrate may be formed of silicon, and a portion of the substrate between the source and drain regions may be compressively strained by the source and drain regions. The substrate may also be formed of silicon germanium. The source and drain regions may be epitaxial regions.

A method of manufacturing a semiconductor device according to example embodiments may include forming a gate on a substrate. Source and drain regions may be formed in the substrate on both sides of the gate, wherein the source and drain regions may include silicon germanium. A metal layer may be formed on the source and drain regions, wherein the metal layer may include vanadium (V). The metal layer may be annealed to form a germanium silicide layer. The source and drain regions may be formed in grooves etched in the substrate. The source and drain regions may be formed using an epitaxial growth method. The metal layer may further include at least one of platinum (Pt) and nickel (Ni). The metal layer may have a single-layer structure or a multiple-layer structure. Forming the metal layer may include forming a platinum layer on the silicon germanium layer; forming a vanadium layer on the platinum layer; and forming a nickel layer on the vanadium layer. Alternatively, forming the metal layer may include forming a vanadium layer on the silicon germanium layer; forming a platinum layer on the vanadium layer; and forming a nickel layer on the platinum layer. The annealing may be performed using a laser spike annealing (LSA) method.

BRIEF DESCRIPTION OF THE DRAWINGS

The features and advantages of example embodiments may become more apparent in view of the detailed description with reference to the attached drawings in which.

DETAILED DESCRIPTION OF EXAMPLE EMBODIMENTS

Figure 1A:
FIGS. 1A and 1B are cross-sectional views illustrating a method of forming a germanium (Ge) silicide layer according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1B:
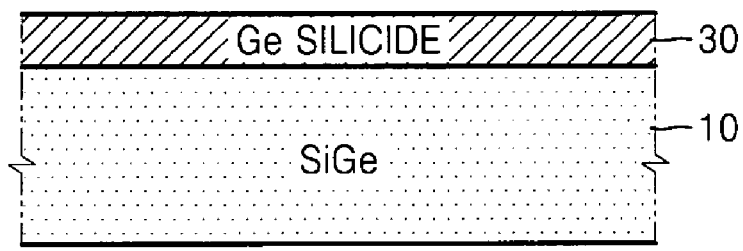

Example embodiments will now be described with reference to the accompanying drawings. In the drawings, the thicknesses of layers and/or regions may have been exaggerated for clarity. FIGS. 1A and 1B are cross-sectional views illustrating a method of forming a Ge silicide (germanosilicide) layer according to example embodiments. Referring to FIG. 1A, a metal layer 20 containing vanadium (V) may be formed on a silicon germanium layer 10. The silicon germanium layer 10 may be a $Si_{1-X}Ge_X$ layer, wherein X is a real number satisfying 0<X<1. The silicon germanium layer 10 may be an epitaxial layer formed using an epitaxial growth method on a predetermined substrate (not shown). The predetermined substrate may be a silicon substrate. The silicon germanium layer 10 may also be used as a conductive region (e.g., source/drain region) in semiconductor devices (e.g., transistors). The silicon germanium layer 10 may be doped with conductive impurities.

Figure 2:
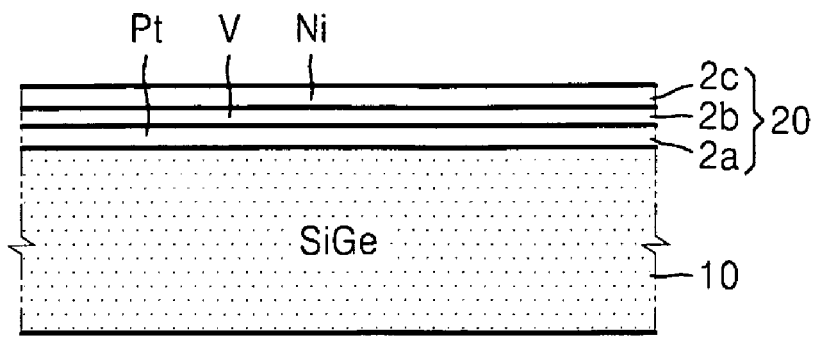
FIGS. 2 and 3 are cross-sectional views illustrating multiple-layer structures of metal layers according to example embodiments.
Figure 3:
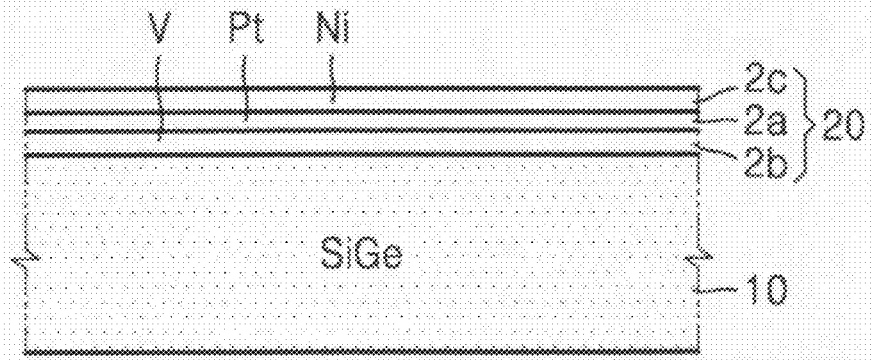

The metal layer 20 may be a single-layer structure or a multiple-layer structure. In addition to vanadium (V), and the metal layer 20 may further include at least one of platinum (Pt) and nickel (Ni). For instance, the metal layer 20 may be an alloy layer containing vanadium and at least one of platinum (Pt) and nickel (Ni). Alternatively, the metal layer 20 may be a multiple-layer structure including a vanadium (V) layer and at least one of a platinum (Pt) layer and a nickel (Ni) layer. FIGS. 2 and 3 are cross-sectional views illustrating multiple-layer structures of metal layers according to example embodiments. Referring to FIG. 2, the metal layer 20 may be formed by sequentially stacking a platinum layer 2a, a vanadium layer 2b, and a nickel layer 2c on the silicon germanium layer 10. Referring to FIG. 3, the metal layer 20 may be formed by sequentially stacking a vanadium layer 2b, a platinum layer 2a, and a nickel layer 2c on the silicon germanium layer 10. The ratio of the thicknesses of the platinum layer 2a, the vanadium layer 2b, and the nickel layer 2c may be about 1:1:5, although example embodiments are not limited thereto as a variety of suitable ratios are possible.

Referring to FIG. 1B, the metal layer 20 on the silicon germanium layer 10 may be annealed to form a germanium silicide layer 30. The annealing process may be performed using a laser spike annealing (LSA) method. The LSA method may be performed at a temperature of about 200-500° C. for several ns to several tens of ns. The laser energy may be in the range of about 150-950 $mJ/cm^2$. To generate the laser, at least one of Xe, HCl, $H_2$, and $N_2$ gases may be used.

The LSA method may enable the relatively quick annealing of an object by irradiating a laser onto a surface of the object for a relatively short period of time. By using a LSA method, the agglomeration of particles in the annealed object may be reduced or suppressed. As a result, the surface roughness of a Ge silicide layer formed using the LSA method may be relatively low. By using the LSA method, the diffusion of the metal particles of the metal layer 20 into the silicon germanium layer 10 may also be reduced or prevented. Consequently, a Ge silicide layer having a relatively small thickness may be formed. Furthermore, the deformation and/or deterioration of the characteristics of the silicon germanium layer 10 may be reduced or prevented.

As mentioned above, a Ge silicide layer 30 containing vanadium (V), as illustrated in FIG. 1B, may be formed by annealing. The Ge silicide layer 30 may be a layer formed by the reaction of a portion of the silicon germanium layer 10 and an adjoining portion of the metal layer 20. If the metal layer 20 includes a nickel layer, a platinum layer, and a vanadium layer, then the Ge silicide layer 30 of FIG. 1B may be a NiPtVSiGe layer. The surface roughness of the Ge silicide layer 30 may be relatively small (e.g., on the scale of several nm). The thickness of the Ge silicide layer 30 may be several nm to several tens of nm (e.g., 10-60 nm). If impurities and/or unreacted metals are present on the Ge silicide layer 30, then a wet cleaning process may be performed to remove the impurities and/or unreacted metals.

Referring to FIG. 1B, the silicon germanium layer 10 may be a first conductive region of a semiconductor device. For example, the silicon germanium layer 10 may be a source/drain region of a transistor. The silicon germanium layer 10 may also be a p-type conductive region or an n-type conductive region of a diode. Additionally, a conductive layer (e.g., conductive plug) (not shown) may be formed on the Ge silicide layer 30. The conductive layer may provide a current path through which electrical signals may be supplied to/from the silicon germanium layer 10. The Ge silicide layer 30, which may have a relatively low electrical resistance, may be formed between the silicon germanium layer 10 and the conductive layer (not shown) to reduce the contact resistance between the silicon germanium layer 10 and the conductive layer.

Figure 4A:
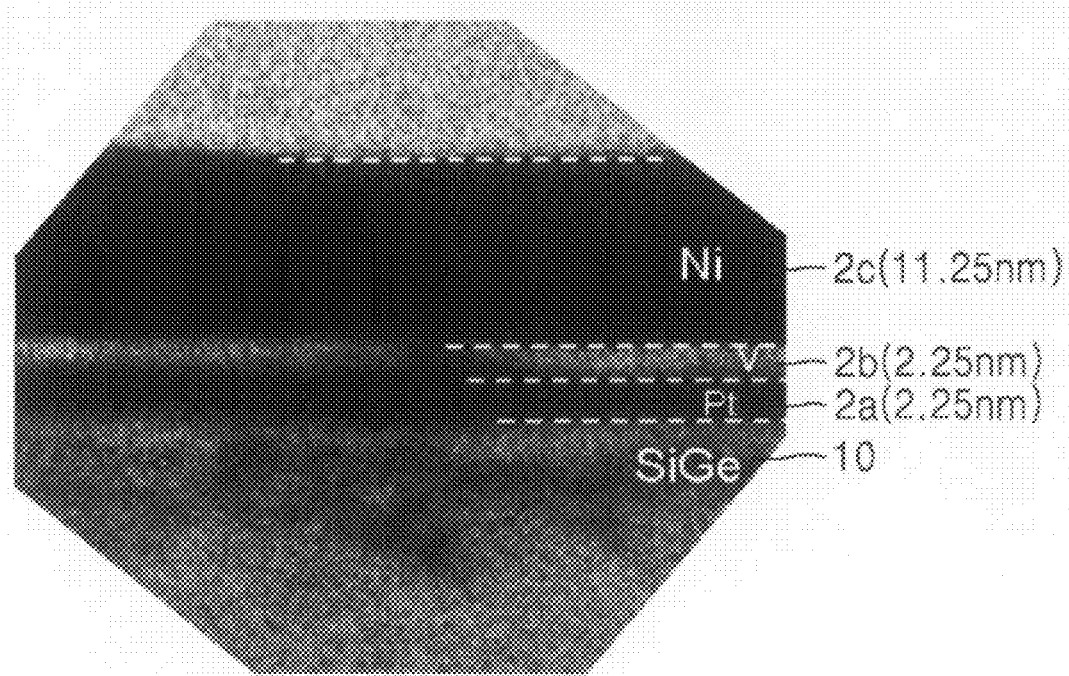
FIG. 4A is a transmission electron microscope (TEM) photographic image of a cross-section of the structure of FIG. 2 according to example embodiments.

FIG. 4A is a transmission electron microscope (TEM) photographic image of a cross-section of the structure of FIG. 2 according to example embodiments. In FIG. 4A, the thicknesses of the platinum layer 2a, the vanadium layer 2b, and the nickel layer 2c may be about 2.25 nm, 2.25 nm, and 11.25 nm, respectively. Thus, the ratio of the thicknesses of the platinum layer 2a, the vanadium layer 2b, and the nickel layer 2c may be about 1:1:5.

Figure 4B:
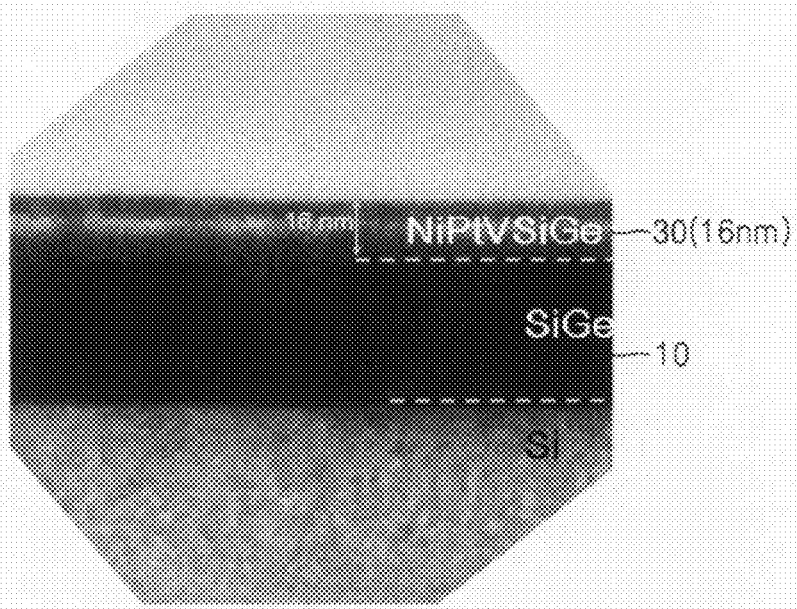
FIG. 4B is a TEM photographic image of a cross-section of the structure of FIG. 4A after annealing according to example embodiments.

FIG. 4B is a TEM photographic image of a cross-section of the structure of FIG. 4A after annealing according to example embodiments. The annealing may be performed using a laser spike annealing (LSA) method. The energy of the laser energy may be about 550 mJ/cm$^2$. Referring to FIG. 4B, the Ge silicide layer 30 (e.g., a NiPtVSiGe layer) may have a thickness of about 16 nm. The thickness of the Ge silicide layer 30 of FIG. 4B may be adjusted by varying the thicknesses of the platinum layer 2a, the vanadium layer 2b, and/or the nickel layer 2c of FIG. 4A. The thickness of the Ge silicide layer 30 may also be adjusted by varying the annealing process conditions.

Figure 5:
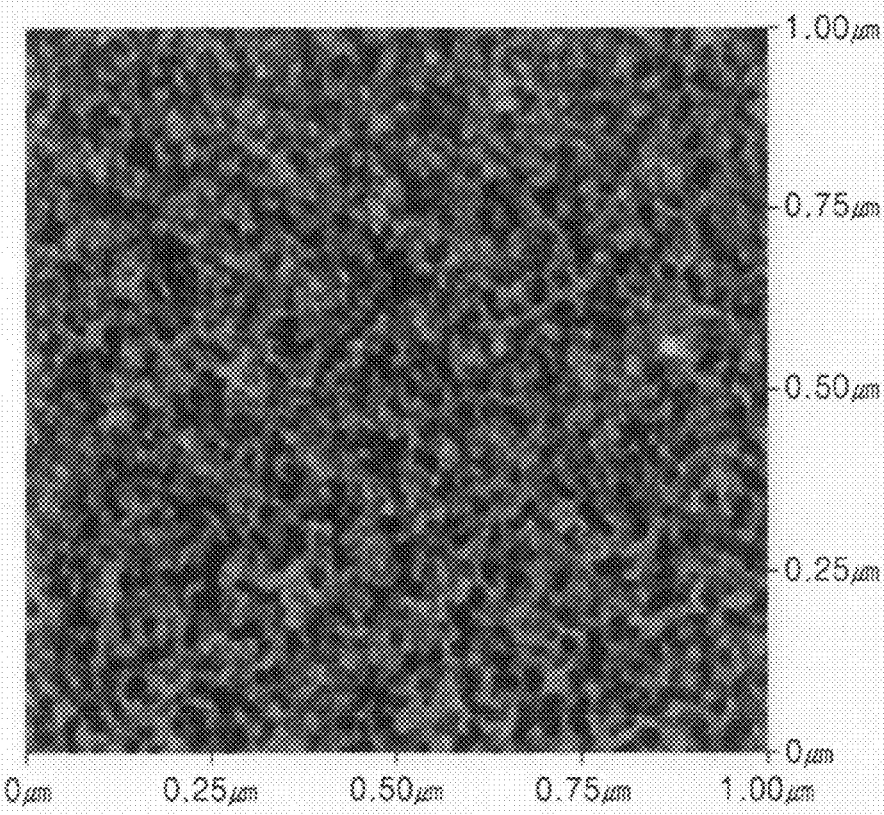
FIG. 5 is a scanning electron microscope (SEM) photographic image of a surface of the Ge silicide layer of FIG. 4B according to example embodiments.

FIG. 5 is a scanning electron microscope (SEM) photographic image showing a surface of the Ge silicide layer 30 of FIG. 4B according to example embodiments. The roughness of the surface of the Ge silicide layer 30, as shown in FIG. 5, was measured to be about 1.557 nm, which may be considered to be relatively small. As a result, the surface of the Ge silicide layer 30 formed according to example embodiments may provide lower contact resistance.

The sheet resistance of two Ge silicide layer samples (e.g., NiPtVSiGe layer samples) formed according to example embodiments were measured as shown below in Table 1.

TABLE 1

| | Annealing Laser Energy (mJ/cm$^2$) | Sheet resistance ($\Omega/\square$) |
|---|---|---|
| First Sample | 300 | 25.7453 |
| Second Sample | 550 | 30.1039 |

The thickness of each of the first and second samples was about 16 nm. Referring to Table 1, first Ge silicide layer sample was formed using an annealing laser energy of about 300 mJ/cm$^2$ and was measured to have a sheet resistance of about 25.7453 $\Omega/\square$ (ohms/square). The second Ge silicide layer sample was formed using an annealing laser energy of about 550 mJ/cm$^2$ and was measured to have a sheet resistance of about 30.1039 $\Omega/\square$ (ohms/square). Thus, the sheet resistance of the first sample was measured to be lower than the sheet resistance of the second sample. Accordingly, the sheet resistance of a Ge silicide layer may be controlled by adjusting process conditions (e.g., annealing laser energy).

Figure 6:
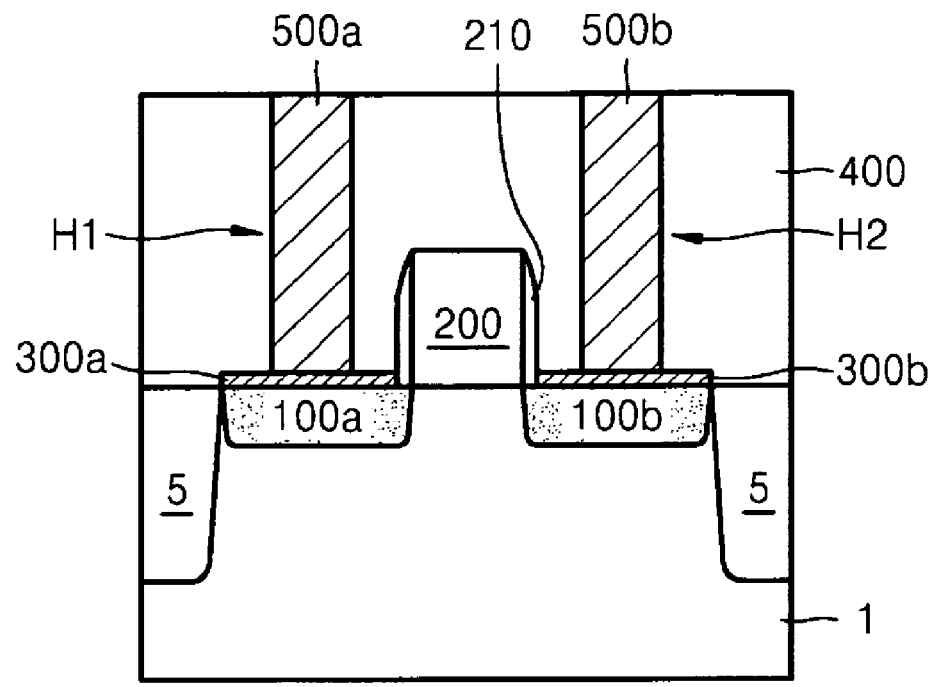
FIG. 6 is a cross-sectional view of a semiconductor device including a Ge silicide layer according to example embodiments.

FIG. 6 is a cross-sectional view of a semiconductor device including a Ge silicide layer according to example embodiments. Referring to FIG. 6, a device isolation layer 5 defining an active region may be formed in a substrate 1. The substrate 1 may be formed of silicon. Alternatively, the substrate 1 may be formed of other materials (e.g., silicon germanium). The substrate 1 may include source and drain regions 100a and 100b in the active region. The source and drain regions 100a and 100b may be formed of silicon germanium ($Si_{1-X}Ge_X$), wherein X is a real number satisfying 0<X<1. The source and drain regions 100a and 100b may be regions doped with predetermined conductive impurities. For example, the source and drain regions 100a and 100b may be equivalent to the silicon germanium layer 10 of FIG. 1B.

A gate 200 may formed on a region of the substrate 1 between the source and drain regions 100a and 100b. The gate 200 may include a sequentially stacked gate insulating layer (not shown) and gate conductive layer (not shown). The gate 200 may further include a hard mask layer (not shown) on the gate conductive layer. An insulating spacer 210 may be formed on both sidewalls of the gate 200. A first Ge silicide layer 300a and second Ge silicide layer 300b may be formed on the source region 100a and drain region 100b, respectively. The first and second Ge silicide layers 300a and 300b may be equivalent to the Ge silicide layer 30 of FIG. 1B.

An interlayer insulating layer 400 may be formed on the substrate 1 to cover the device isolation layer 5, the first and second Ge silicide layers 300a and 300b, the gate 200, and the insulating spacer 210. The interlayer insulating layer 400 may have first and second contact holes H1 and H2 exposing the first and second Ge silicide layers 300a and 300b, respectively. First and second conductive plugs 500a and 500b may be formed in the first and second contact holes H1 and H2, respectively. The first and second conductive plugs 500a and 500b may be formed to different heights, and the height of the interlayer insulating layer 400 may vary depending on the region of the semiconductor device. The first and second Ge silicide layers 300a and 300b may have a relatively low specific resistance, thereby reducing the contact resistance between the source and drain regions 100a and 100b and the first and second conductive plugs 500a and 500b, respectively. Accordingly, the ON-current of the semiconductor device (e.g., transistor) may be increased by the first and second Ge silicide layers 300a and 300b.

If the substrate 1 is formed of silicon, then a portion of the substrate 1 between the source and drain regions 100a and 100b (e.g., channel region) may be a compressively strained silicon region. The channel region may be compressively strained, because the lattice constant of the source and drain regions 100a and 100b on both sides of the channel region may be greater than the lattice constant of the channel region. If the channel region is a compressively strained silicon region, then hole mobility in the channel region may be relatively high. Accordingly, the semiconductor device according to example embodiments may exhibit improved performance as a p-channel metal oxide semiconductor (MOS) transistor.

Figure 7A:
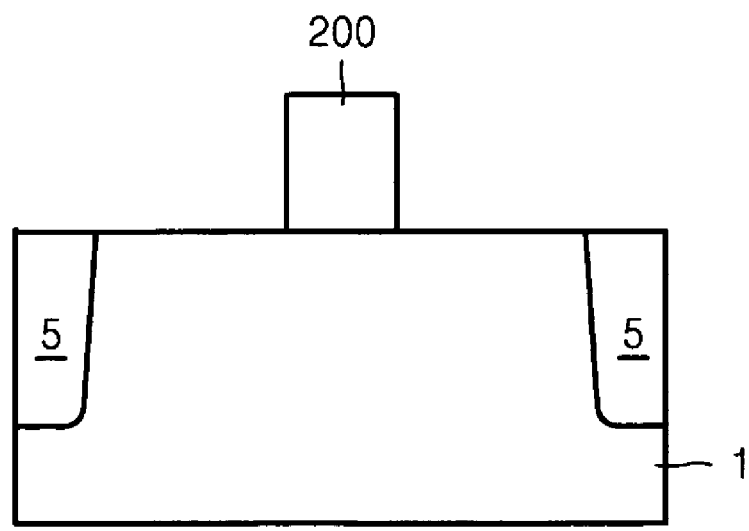
FIGS. 7A through 7E are cross-sectional views illustrating a method of manufacturing a semiconductor device according to example embodiments.
Figure 7B:
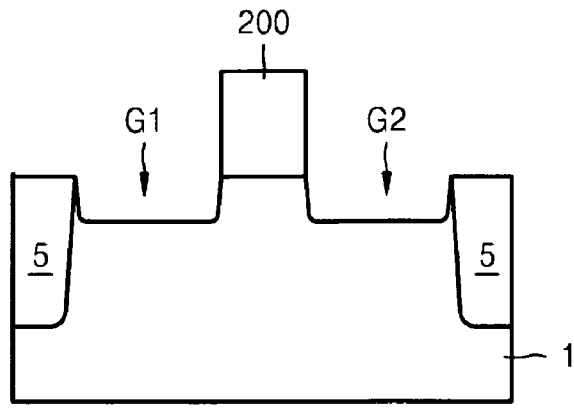
Figure 7C:
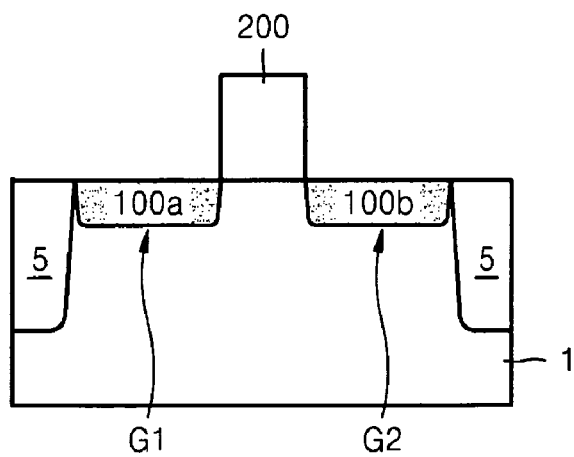

FIGS. 7A through 7E illustrate a method of manufacturing a semiconductor device according to example embodiments. Referring to FIG. 7A, a substrate 1 having a device isolation layer 5 defining an active region may be provided. A gate 200 may be formed on the active region of the substrate 1. The gate 200 may include a sequentially stacked gate insulating layer (not shown) and gate conductive layer (not shown). The gate 200 may also include a hard mask layer (not shown) on the gate conductive layer. Referring to FIG. 7B, portions of the active region on both sides of the gate 200 may be etched to a predetermined thickness to form first and second grooves G1 and G2. Referring to FIG. 7C, source and drain regions 100a and 100b may be formed of silicon germanium in the first and second grooves G1 and G2, respectively. The source and drain regions 100a and 100b may be formed using an epitaxial growth method and may be regions doped with conductive impurities.

Figure 7D:
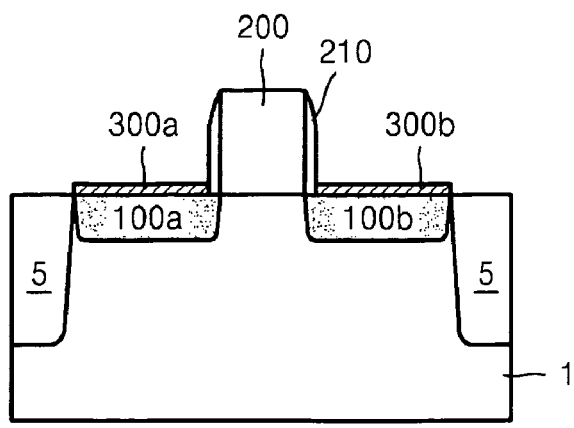
Figure 7E:
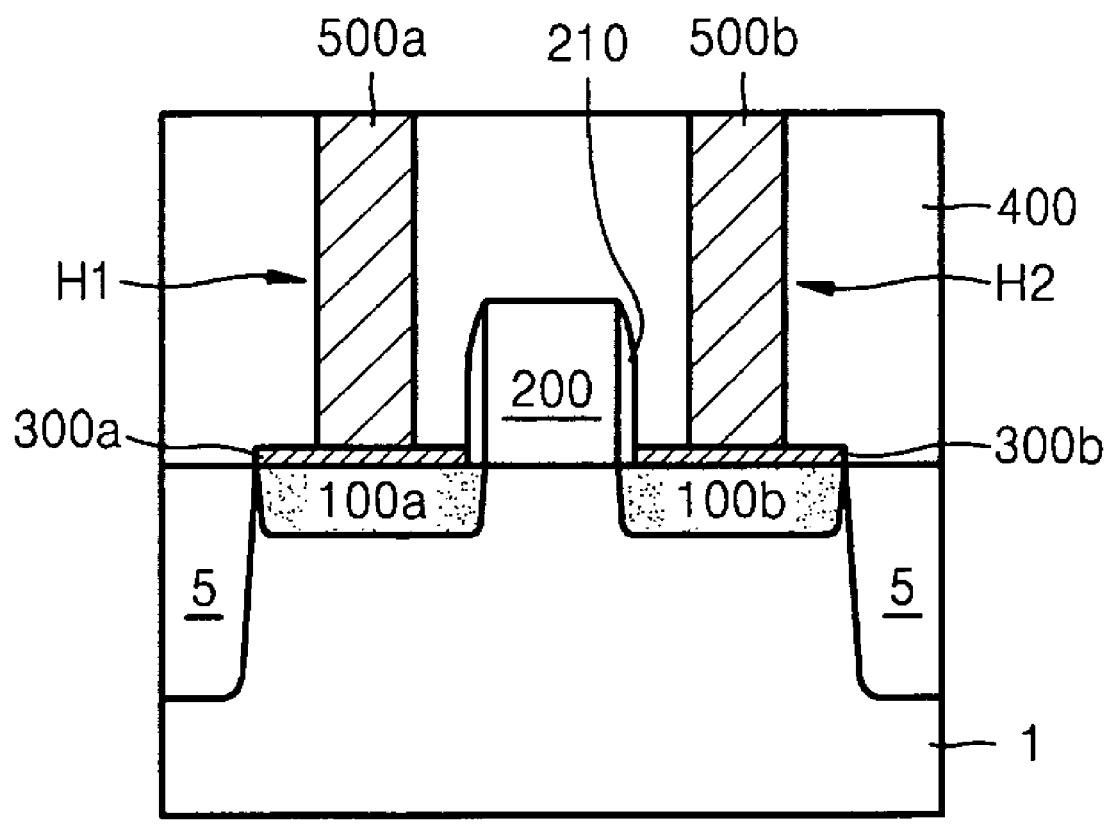

Referring to FIG. 7D, an insulating spacer 210 may be formed on both sidewalls of the gate 200. First and second Ge silicide layers 300a and 300b may be formed on the source and drain regions 100a and 100b, respectively. The first and second Ge silicide layers 300a and 300b may be formed using the methods described above with reference to FIGS. 1A-1B and 2-3. Consequently, metal particles may be suppressed from diffusing into the source and drain regions 100a and 100b, thus reducing or preventing the deterioration of the characteristics of the source and drain regions 100a and 100b. Referring to FIG. 7E, an interlayer insulating layer 400 may be formed on the substrate 1 to cover the device isolation layer 5, the first and second Ge silicide layers 300a and 300b, the gate 200, and the insulating spacer 210. The interlayer insulating layer 400 may be etched to form first and second contact holes H1 and H2 exposing the first and second Ge silicide layers 300a and 300b, respectively. First and second conductive plugs 500a and 500b may be formed in the first and second contact holes H1 and H2, respectively. The first and second Ge silicide layers 300a and 300b may reduce the contact resistance between the source and drain regions 100a and 100b and the first and second conductive plugs 500a and 500b, respectively.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A method of forming a germanium silicide layer, comprising:
 forming a metal layer including vanadium on a silicon germanium layer; and
 annealing the metal layer to form the germanium silicide layer,
 wherein the metal layer is formed to have a multi-layer structure including a platinum layer, a vanadium layer, and a nickel layer.

2. The method of claim 1, further comprising:
 forming the platinum layer on the silicon germanium layer;
 forming the vanadium layer on the platinum layer; and
 forming the nickel layer on the vanadium layer.

3. The method of claim 1, further comprising:
 forming the vanadium layer on the silicon germanium layer;
 forming the platinum layer on the vanadium layer; and
 forming the nickel layer on the platinum layer.

4. The method of claim 1, wherein the annealing is performed using a laser spike annealing method.

5. The method of claim 4, wherein the laser spike annealing method is performed at a temperature of about 200-500° C. for several ns to several tens of ns.

6. The method of claim 4, wherein the laser spike annealing method utilizes a laser energy in the range of about 150-950 mJ/cm$^2$.

7. The method of claim 1, wherein the silicon germanium layer is formed using an epitaxial growth method.

8. The method of claim 1, wherein the metal layer is formed such that a ratio of the thicknesses of the platinum layer, vanadium layer, and nickel layer is about 1:1:5.

9. A method of manufacturing a semiconductor device, comprising:
 forming a gate on a substrate;
 forming source and drain regions in the substrate on both sides of the gate, the source and drain regions including silicon germanium;
 forming a metal layer on the source and drain regions, the metal layer including vanadium; and
 annealing the metal layer to form a germanium silicide layer,
 wherein the metal layer is formed to have a multi-layer structure including a platinum layer, a vanadium layer, and a nickel layer.

10. The method of claim 9, wherein the source and drain regions are formed in grooves etched in the substrate.

11. The method of claim 9, wherein the source and drain regions are formed using an epitaxial growth method.

12. The method of claim 9, wherein forming the metal layer includes
 forming the platinum layer on the silicon germanium layer;
 forming the vanadium layer on the platinum layer; and
 forming the nickel layer on the vanadium layer.

13. The method of claim 9, wherein forming the metal layer includes
 forming the vanadium layer on the silicon germanium layer;
 forming the platinum layer on the vanadium layer; and
 forming the nickel layer on the platinum layer.

14. The method of claim 9, wherein the annealing is performed using a laser spike annealing method.

15. The method of claim 14, wherein the laser spike annealing method is performed at a temperature of about 200-500° C. for several ns to several tens of ns.

16. The method of claim 14, wherein the laser spike annealing method utilizes a laser energy in the range of about 150-950 mJ/cm$^2$.

17. The method of claim 9, wherein the metal layer is formed such that a ratio of the thicknesses of the platinum layer, vanadium layer, and nickel layer is about 1:1:5.

* * * * *